(12) United States Patent
Smythe et al.

(10) Patent No.: US 8,223,539 B2
(45) Date of Patent: Jul. 17, 2012

(54) GCIB-TREATED RESISTIVE DEVICE

(75) Inventors: John Smythe, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 12/693,936

(22) Filed: Jan. 26, 2010

(65) Prior Publication Data

US 2011/0182103 A1 Jul. 28, 2011

(51) Int. Cl.
*G11C 11/34* (2006.01)
(52) U.S. Cl. ........ 365/178; 365/148; 365/151; 365/164; 365/174
(58) Field of Classification Search .................. 365/148, 365/151, 164, 174, 178
See application file for complete search history.

(56) References Cited

U.S. PATENT DOCUMENTS

| | | | |
|---|---|---|---|
| 5,907,780 A | 5/1999 | Gilmer et al. | |
| 6,482,657 B2 * | 11/2002 | Shimazawa | 438/3 |
| 6,495,474 B1 * | 12/2002 | Rafferty et al. | 438/766 |
| 7,186,992 B2 | 3/2007 | Nickel | |
| 7,504,135 B2 * | 3/2009 | Nickel | 427/525 |
| 7,749,849 B2 * | 7/2010 | Hu et al. | 438/292 |
| 7,754,588 B2 * | 7/2010 | Russell et al. | 438/514 |
| 7,759,254 B2 * | 7/2010 | Sasaki et al. | 438/717 |
| 7,833,889 B2 * | 11/2010 | Pillarisetty et al. | 438/585 |
| 7,947,582 B2 * | 5/2011 | Hautala et al. | 438/515 |
| 2002/0006877 A1 | 1/2002 | Chu et al. | |
| 2003/0021908 A1 | 1/2003 | Nickel et al. | |
| 2006/0292762 A1 | 12/2006 | Borland et al. | |
| 2007/0200158 A1 | 8/2007 | Genrikh et al. | |
| 2008/0079029 A1 | 4/2008 | Williams | |
| 2008/0090337 A1 | 4/2008 | Williams | |
| 2008/0220601 A1 | 9/2008 | Kumar et al. | |
| 2009/0152629 A1 | 6/2009 | Hu et al. | |
| 2011/0165728 A1 * | 7/2011 | Greeley et al. | 438/102 |
| 2012/0001144 A1 * | 1/2012 | Greeley et al. | 257/4 |

OTHER PUBLICATIONS

Yang, J. Joshua, et al., "A Family of Non-configurable nanodevices", Advanced Materials, vol. 21 (pp. 3754-3758) (2009).
International Search Report and Written Opinion for related PCT Application No. PCT/US2011/000134 dated Aug. 30, 2011 (10 pages).

\* cited by examiner

*Primary Examiner* — Viet Q Nguyen
(74) *Attorney, Agent, or Firm* — Brooks, Cameron & Huebsch, PLLC

(57) ABSTRACT

The present disclosure includes GCIB-treated resistive devices, devices utilizing GCIB-treated resistive devices (e.g., as switches, memory cells), and methods for forming the GCIB-treated resistive devices. One method of forming a GCIB-treated resistive device includes forming a lower electrode, and forming an oxide material on the lower electrode. The oxide material is exposed to a gas cluster ion beam (GCIB) until a change in resistance of a first portion of the oxide material relative to the resistance of a second portion of the oxide material. An upper electrode is formed on the first portion.

38 Claims, 9 Drawing Sheets

GCIB-TREATED RESISTIVE DEVICE

TECHNICAL FIELD

The present disclosure relates generally to the field of semiconductor devices. More particularly, in one or more embodiments the present disclosure relates to a gas cluster ion beam (GCIB) treated resistive devices and methods of forming a GCIB-treated resistive device.

BACKGROUND

Resistive devices can be used as semiconductor resistors, switches, or memory elements (e.g., memory cells of a memory device), among other applications. Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, and resistive random access memory (RRAM), among others.

Memory devices are utilized as non-volatile memory for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a portable music player (e.g., MP3 player), a movie player, and other electronic devices, among others. Program code and system data, such as a basic input/output system (BIOS), are typically stored in non-volatile memory devices.

Memory cells can be arranged in a matrix (e.g., an array). For example, an access device (e.g., transistor) of a number of memory cells may be coupled to an access line (one example of which is a "word line") forming a "row" of the array. The memory elements of each memory cell are coupled to a data line (one example of which is a "bit line") in a "column" of the array. In this manner, the access device of a memory cell is accessed through a row decoder activating a row of memory cells by selecting the word line coupled to their gates. The programmed state of a row of selected memory cells is determined by causing different currents to flow in the memory elements depending on the resistance associated with a programmed state for a particular memory cell.

Memory cells can be programmed (e.g., write, erase) to a desired state. That is, one of a number of programmed (e.g., resistance) states can be set for a memory cell. For example, a single level cell (SLC) can represent one of two logic states (e.g., 1, 0). Resistive memory cells can also be programmed to one of more than two programmed states, such as to represent more than two binary digits (e.g., 1111, 0111, 0011, 1011, 1001, 0001, 0101, 1101, 1100, 0100, 0000, 1000, 1010, 0010, 0110, 1110). Such cells may be referred to as multi state memory cells, multi-digit cells, or multilevel cells (MLCs).

Non-volatile resistive memory such as RRAM stores data by varying the resistance of a resistive memory element. Data may be written to a selected memory cell in an RRAM by applying a predetermined voltage, at a predetermined polarity, for a predetermined duration, to a particular resistive element. RRAM can be programmed to a number of resistance states by application of voltage of various magnitudes, polarities, and/or durations.

One type of resistive memory element is a memristor. Memristors can be used to form RRAM. Such an RRAM can be formed of a material that can be configured to provide variable resistance, such as an oxide (e.g., metal oxide such as a transition metal oxide (TMO), nitrides, etc.). The RRAM may utilize a resistance transition characteristic of the TMO by which resistance of the material varies according to a change in application of voltage. Memristors can be implemented in nanoscale devices, thereby enabling storage elements to provide a high density, low cost, non-volatile, high speed RAM without the read/write cycle endurance limitations of charge-storage type memory.

A resistive device can have an active region that is formed of one or more materials that are electronically semiconducting (e.g., nominally electronically insulating) and also are weakly ionic conductor(s). Material(s) of the active region can be capable of hosting and transporting ions that act as dopants to control the flow of electrons through the material (s). Ionic transport may also be understood as the transport of the absence of a particular ion (e.g., ionic vacancies), similar to understanding electric current by the movement of "holes" representing the absence of an electron. That is, ionic vacancies appear to move in a direction opposite to that of the corresponding ions.

According to one previous approach, the active region of a resistive device is formed by depositing two discrete materials that differ in some initial characteristic (e.g., concentration of ionic vacancies). Operation of the resistive device involves transport of ionic vacancies from the first region, across a boundary between the two discrete regions, to the material of the second region. The active region thus comprises, for example, a primary material for transporting and hosting ions that act as dopants to control the flow of electrons, and a secondary material for providing a source of ionic dopants for the primary material. However, the physical boundary between the two regions of material that differ in some initial characteristic can result in some undesirable consequences.

One limitation of one or more previous resistive device fabrication approaches is an inability to control small changes in atomic and vacancy arrangement during the film stack creation, and to not damage the thin film stack during patterning. Previous methods for creating oxides from metals also tend to be grain boundary sensitive. Grain boundaries can result from a lack of fabrication control while forming a plurality of discrete regions (e.g., materials). Due to small feature size limitations (e.g., sub 20 nm), direct deposition methods are limited.

According to another previous approach, the active region of a resistive device is formed by depositing one material (e.g., a material), and using a voltage (e.g., 5-10 V) in forming the resistive device that is stronger than the electric field (e.g., 2-2.5 V) that is used to thereafter operate the resistive device to form two regions within the active region that differ in some characteristic (e.g., concentration of ionic vacancies). The two regions can form a gradient, with one end of the gradient acting as a first "region" and an opposite end of the gradient acting as a second "region." However, the application of a strong electric field, perhaps for an extended period of time, in initially forming the two regions with one material can result in some undesirable consequences. For example, application of a voltage large enough to initially form the two regions (e.g., 5-10 V) can cause dielectric leakage and/or change the threshold of the dielectric.

Furthermore, applying a higher voltage bias to resistance device causes both electron current and ion current to flow, whereas at a lower voltage bias the flow of ion current is negligible, which allows the switch to hold its resistance state. Therefore, where a strong electrical field is used initially in forming two regions, the higher voltage bias can cause unintended ions in the molecular structure to move (e.g., sodium ions can become mobile and move as the oxygen vacancies are being moved). For these and other reasons, a method for forming two regions (e.g., portions) of an active region, the regions being defined based on ionic species concentration (e.g., of oxygen vacancies), without having to move the ionic species using relatively strong electric fields, would be advantageous.

One previous mode of operating the resistive device after formation is to apply a relatively large electrical field across the resistive device that exceeds some threshold for enabling the motion of the ions (or vacancies) in the material(s) to cause an ionic species (or vacancy thereof) to be transported via ionic transport (e.g., into or out of the first material from/to the second material, or into or out of a first region from/to a second region initially formed of similar material and subsequently altered by application of a strong electric field).

Accordingly, a method for forming a resistive device without the disadvantages associated with the deposition of two separate materials (e.g., grain boundaries) or the application of a strong electrical field for initially in forming two regions would be beneficial.

DETAILED DESCRIPTION

Figure 1:
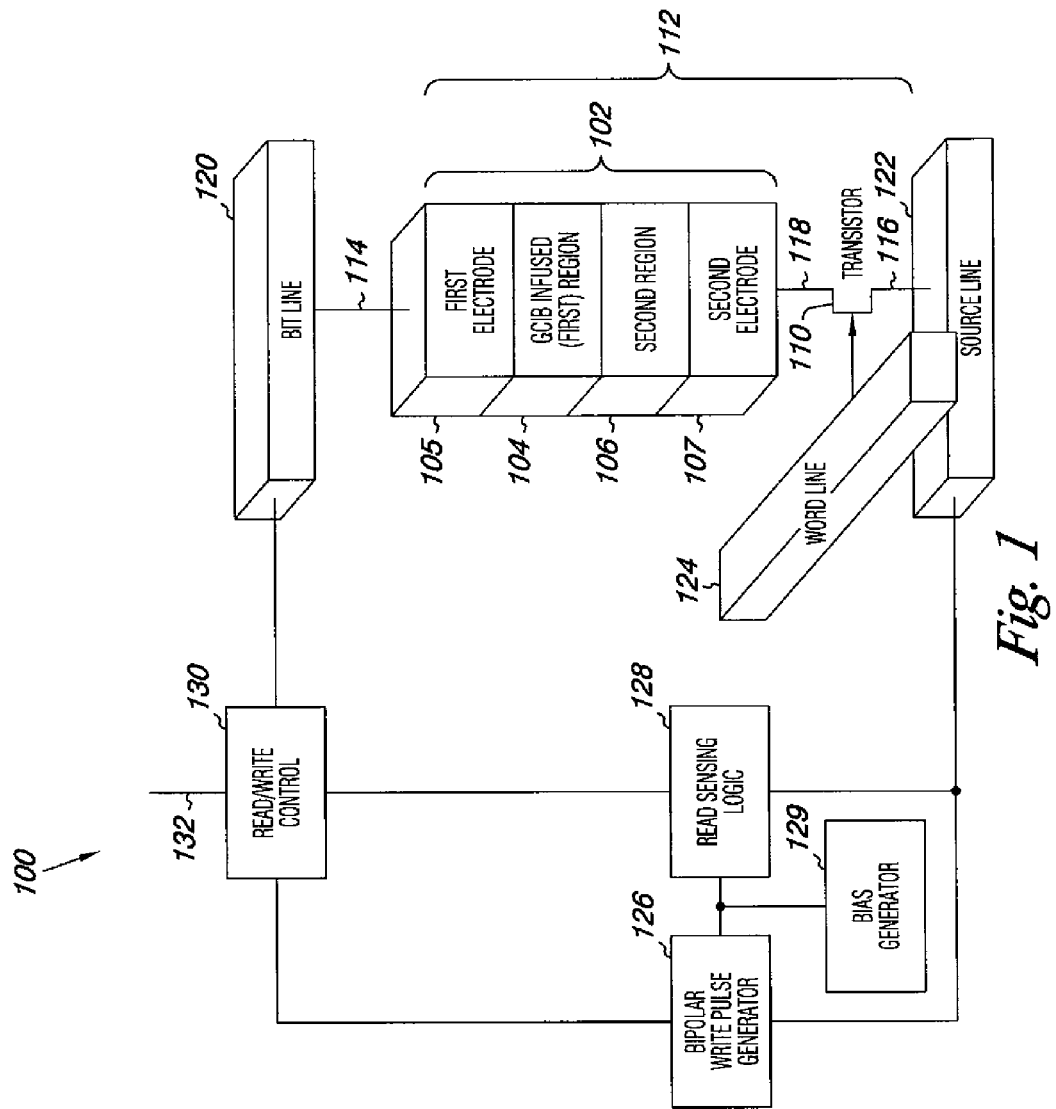
FIG. 1 is a functional block diagram of a non-volatile memory implemented using a gas cluster ion beam (GCIB)-treated resistive device in accordance with one or more embodiments of the present disclosure.

The present disclosure includes GCIB-treated resistive devices, devices utilizing GCIB-treated resistive devices (e.g., as switches, memory cells), and methods for forming the GCIB-treated resistive devices. One method of forming a GOB-treated resistive device includes forming a lower electrode, and forming an oxide material on the lower electrode. The oxide material is exposed to a gas cluster ion beam (GCIB) until a change occurs in resistance of a first portion of the oxide material relative to a second portion of the oxide material. An upper electrode is formed on the first portion.

The figures herein follow a numbering convention in which the first digit or digits correspond to the drawing figure number and the remaining digits identify an element or component in the drawing. Similar elements or components between different figures may be identified by the use of similar digits. For example, element "02" may be referenced as 102 in FIG. 1, and a similar element may be referenced as 202 in FIG. 2.

The ionic species are specifically chosen from those that act as electrical dopants for the material(s), and thereby change the electrical conductivity of the material(s) from lower conductivity of an undoped semiconductor (e.g., insulator) to a higher conductivity of a doped semiconductor. One having ordinary skill in the art will appreciate that the resistive device may thus act as a switch using the lower conductivity state (e.g., higher resistive state) as a switch-ON configuration, and the higher conductivity state (e.g., lower resistive state) as a switch-OFF configuration. One having ordinary skill in the art will further appreciate that the resistive device may thus act as a memory element with one resistive state corresponding to a first logic state, and another resistive state corresponding to a another logic state.

FIG. 1 is a functional block diagram of a non-volatile memory 100 implemented using a resistive device 102 in accordance with one or more embodiments of the present disclosure. The resistive device can include a gas cluster ion beam (GCIB) infused region 104 (e.g., a first region) and second region 106, formed between a first electrode 105 and a second electrode 107. The GCIB-treated resistive device 102 can have a first terminal 114 and a second terminal 118. While FIG. 1 shows the GCIB-treated resistive device 102 being formed to have only two regions (e.g., first region 104 and second region 106), embodiments of the present disclosure are not so limited. For example, embodiments of the present disclose may be implemented with additional regions, materials, configurations, and/or features, which are omitted from FIG. 1 for clarity.

An access device (e.g., transistor) 110 is coupled in series with the GCIB-treated resistive device 102 to form a memory cell 112. Access device 110 serves as a switch for enabling and disabling current flow through the GCIB-treated resistive device 102. Access device 110 may be, for example, a complementary metal oxide semiconductor (CMOS) transistor with a gate coupled to a word line 124. However, embodiments of the present disclosure are not limited to any particular type of access device, and can be implemented using other types of switching devices. Thus, when word line 124 voltages are applied to activate/deactivate access device 110 to appropriately complete the circuit between a source line 122 and a bit line 120 through the GCIB-treated resistive device 102. As shown, memory cell 112 is coupled to the bit line 120 by the first terminal 114, and coupled to the source line 122 by the second terminal 116.

According to one or more embodiments, the bit line 120 and source line 122 are coupled to logic for reading from, and logic for writing to, the memory cell 112. For example, a read/write control multiplexer 130 has an output coupled to the bit line 120. The read/write control multiplexer 130 is controlled by a read/write control logic line 132 to select between a first input coupled to a bipolar write pulse generator 126, and a second input coupled to a read sensing logic 128. The amount, polarity, and/or duration of voltage potential applied to the memory element 102 for programming may be controlled by application thereof between the bit line 120 and the source line 122 associated with the selected memory cell 112.

According to one or more embodiments, during a read operation, a bias generator 129 establishes (through the read sensing logic 128) a read bias voltage potential difference between the bit line 120 and the source line 122 (e.g., a fixed voltage) associated with the selected memory cell 112. The read bias voltage causes a particular magnitude of current to flow corresponding to the resistance of the GCIB-treated resistive device 102 (e.g., the greater the resistance of the GCIB-treated resistive device 102, the smaller the current that flows for a given read bias voltage according to Ohm's law). The amount of current flowing through the GCIB-treated resistive device 102 during a read operation (or a voltage proportional thereto) can be sensed by the read sensing logic 128 (e.g., a sense amp may compare a circuit-derived input to a reference input that corresponds to a boundary condition between two programmed states) to determine an output corresponding to the programmed state represented by the present resistance of the GCIB-treated resistive device 102.

According to one or more embodiments, a read current is applied through the GCIB-treated resistive device 102 causing a corresponding voltage to be developed, which can be sensed and compared to a reference voltage. From the comparison, the resistance of the memory element may be determined (e.g., based on the principles of Ohm's law).

Although FIG. 1 illustrates, and the discussion above describes, a memory cell 112 including one configuration of a GCIB-treated resistive device 102, and particular read and write logic arrangement, one having ordinary skill in the art will appreciate that one or more embodiments of the present disclosure may be implemented using other configurations of a GCIB-treated resistive device and/or other configurations of logic for switching and/or programming the GCIB-treated resistive device 102.

RRAM can include types of RRAM in which different data values may be written in accordance with the polarity of the applied voltage through the GCIB-treated resistive device 102. Such devices are sometimes referred to as a "bipolar RRAM." In the case of a bipolar RRAM, a bit line and source line can be used with each memory cell in order to write different data values to the bipolar RRAM.

Figure 2A:
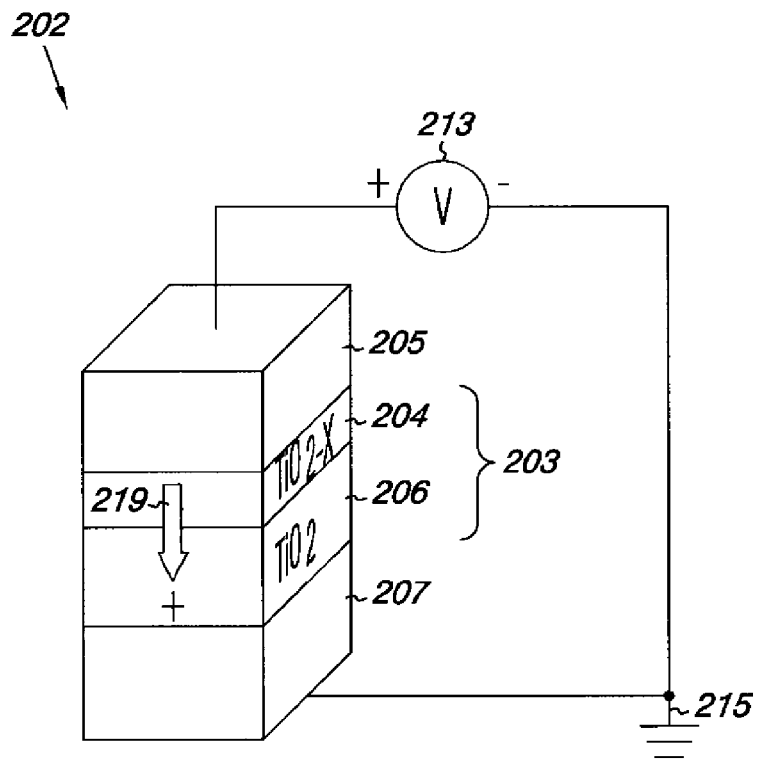
FIG. 2A is a perspective view of a GCIB-treated resistance device being operated to a first resistive state in accordance with one or more embodiments of the present disclosure.

FIG. 2A is a perspective view of a GCIB-treated resistance device being operated to a first resistive state in accordance with one or more embodiments of the present disclosure. In the embodiment illustrated in FIGS. 2A-3A, the active region (e.g., 203 in FIGS. 2A-2B) is initially formed using a thin film of oxide material (e.g., TiOx, NiOx, CuOx, AlOx) and/or nitride material (e.g., metal nitrides such as aluminum nitride). The following operational discussion is based on use of stoichiometric $TiO_2$ to form an active region, with the moving ionic species being oxygen vacancies. However, embodiments of the present disclosure are not so limited, and may for example, be fabricated from metal nitrides with the moving ionic species being nitrides.

The stoichiometric $TiO_2$ active region is subsequently exposed to a gas cluster ion beam to form a first region (e.g., first portion of the active region) and a second region (e.g., second portion of the active region), the regions being defined based on location of oxygen vacancies in the molecular structure of the initial $TiO_2$. Additional fabrication details for various GCIB-treated resistance devices are discussed further with respect to FIGS. 4A-7E below.

FIG. 2A illustrates the GCIB-treated resistance device 202 being operated to obtain a high conductivity state (e.g., low resistance state). To obtain the low resistance state, positively charged donors, such as oxygen vacancies in $TiO_2$, are moved about the active region 203, being driven from the first region 204 into the second region 206 by application of a positive voltage 213 across the GCIB-treated resistance device 202 that exceeds the threshold electric field for the drift of the particular ionized species. The positive voltage 213 may be applied between the first electrode 205 and the second electrode 207. The second electrode 207 may be connected to a reference potential 215. As the second region 206 becomes depleted of charge carriers, the second region 206 can acquire a net positive charge.

Prior to application of the positive voltage 213 and movement of the oxygen vacancies, the first region 204 (e.g., $TiO_{2-x}$) contains a relatively high concentration of oxygen vacancies (e.g., is in an oxidized state), with its stoichiometry being very close to $TiO_2$. Therefore, the $TiO_{2-x}$ region 204 is a relatively good ionic conductor. The $TiO_2$ region 206 however, is depleted of oxygen vacancies. That is, the $TiO_2$ region 206 is essentially intrinsic, and there are very few dopants in the lattice. As such, the transition between the $TiO_{2-x}$ region 204 and the $TiO_2$ region 206 can act as a Schottky barrier.

Application of the positive voltage 213 across the GCIB-treated resistance device 202, with the polarity shown in FIG. 2A, causes the $TiO_{2-x}$ region 204 to become an anode of an electrochemical cell. The $TiO_{2-x}$ region 204 is oxidized by the electrical energy input. Oxygen vacancies are driven out of the $TiO_{2-x}$ region 204 and into the $TiO_2$ region 206, as indicated by arrow 219, thereby reducing the $TiO_2$ region 206.

Since only a relatively small number of oxygen vacancies are pushed out of the $TiO_{2-x}$ region 204, the effect on the relatively good electrical conductivity of the $TiO_{2-x}$ region 204 is fairly small. However, the electrical conductivity of the $TiO_2$ region 206 increases dramatically, since it is changed from having a very low concentration of oxygen vacancies in the molecular structure (e.g., essentially no oxygen vacancies), to a molecular structure (e.g., lattice) having some oxygen vacancies. In this manner, both the $TiO_{2-x}$ region 204 and the $TiO_2$ region 206 are conducting, creating the low resistive state of the GCIB-treated resistance device 202.

The magnitude of the applied voltage used to change resistance states of the GCIB-treated resistance device may depend on the thicknesses and materials of the active region and/or particular portions thereof. According to one or more embodiments, a voltage magnitude in the range of 2.0 to 2.5 volts is used to effect resistance state changes.

Figure 2B:
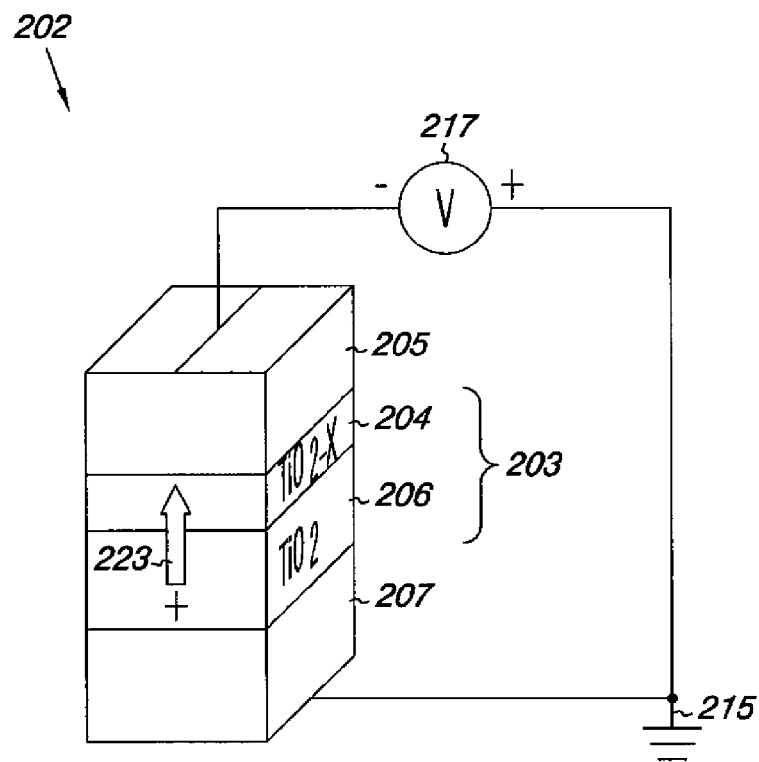
FIG. 2B is a perspective view of a GCIB-treated resistance device being operated to a second resistive state in accordance with one or more embodiments of the present disclosure.

FIG. 2B is a perspective view of a GCIB-treated resistance device beginning operated to a second resistance state in accordance with one or more embodiments of the present disclosure. To obtain a high resistance state, positively charged donors, such as oxygen vacancies in $TiO_2$, are driven from the $TiO_2$ region 206 into the $TiO_{2-x}$ region 204 by application of a reverse-polarity voltage 217. When the reverse-polarity voltage 217 exceeds the threshold electric field for the drift of the particular ionized species (e.g., a vacancy), $TiO_2$ region 206 loses its net positive charge and again becomes charge neutral.

The $TiO_{2-x}$ region 204 still contains a relatively high concentration of oxygen vacancies, and is therefore still a reasonably good conductor. Upon application of the reverse-polarity voltage 217, the $TiO_{2-x}$ region 204 now becomes a cathode of the electrochemical cell. The $TiO_2$ region 206 is oxidized towards intrinsic $TiO_2$, driving the oxygen vacancies out of $TiO_2$ region 206 and back into the $TiO_{2-x}$ region 204 (which is thereby reduced), as shown by arrow 223. The effect on the conductivity of the $TiO_{2-X}$ region 204 is relatively small, but the conductivity of the $TiO_2$ region 206 decreases dramatically as oxygen vacancy concentration approaches zero.

Figure 3A:
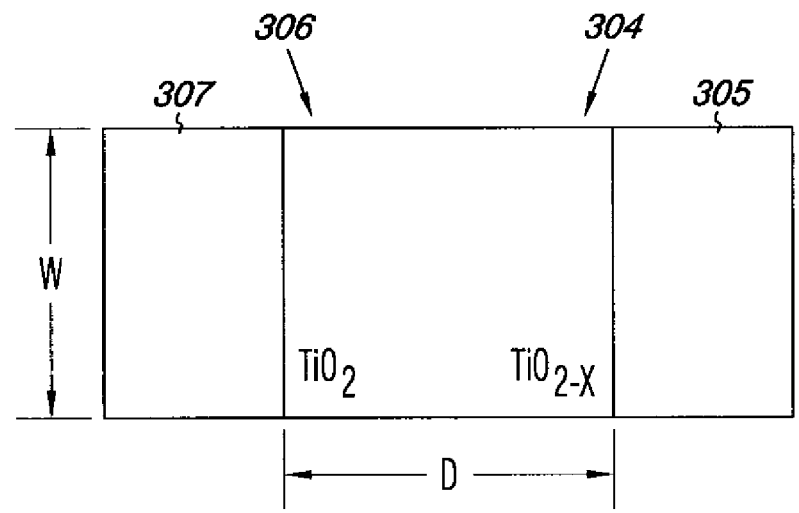
FIG. 3A is a diagram illustrating one example physical layout of a GCIB-treated resistance device in accordance with one or more embodiments of the present disclosure.

If the higher resistance state of the GCIB-treated resistance device is designated as being a logical value "0," and the lower resistance state is designated as being a logical value "1," then the GCIB-treated resistance device can function as a non-volatile memory device since the resistance state persists after the voltage applied to change the resistance states is removed. Referring again to FIG. 1, to read information stored in the GCIB-treated resistance device can function as a non-volatile memory device, an interrogation voltage may be applied to the GCIB-treated resistance device and the current flowing therethrough may be measured. FIG. 3A is a diagram illustrating one example physical layout of a GCIB-treated resistance device in accordance with one or more embodiments of the present disclosure. According to the one or more embodiments, a GCIB-treated resistance device can be fabricated to have an active region width (W) of approximately 2 nm, and an active region depth (including the $TiO_{2-X}$ region 304 and the $TiO_2$ region 306) of approximately 3 nm. However, particular embodiments of the present disclosure are not limited to the afore-mentioned dimensions, and may be fabricated with larger or smaller feature dimensions. The $TiO_2$ region 306, adjacent the second electrode 307, can initially be nearly stoichiometric $TiO_2$ and thus initially be highly resistive. The $TiO_{2-X}$ region 204, adjacent the first electrode 305 can initially be highly oxygen deficient, and thus this region is initially highly conductive.

Figure 3B:
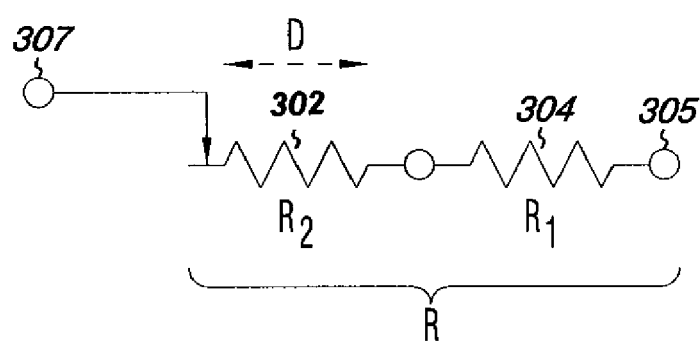
FIG. 3B is an equivalent circuit diagram illustrating variable resistance of a GCIB-treated resistance device in accordance with one or more embodiments of the present disclosure.

FIG. 3B is an equivalent circuit diagram illustrating variable resistance of a GCIB-treated resistance device in accordance with one or more embodiments of the present disclosure. The variable resistor 302 shown in FIG. 3B corresponds to the physical layout of a GCIB-treated resistance device shown in FIG. 3A. The total resistance R of the GCIB-treated resistance device is the sum of the resistance of the $TiO_{2-X}$ region 304 (R1) plus the resistance of the $TiO_2$ region 306 (R2). As described above, the change to the oxygen vacancy concentration of the $TiO_{2-X}$ region 304 due to application of voltage across the GCIB-treated resistance device is relatively small, thus the resistance R1 remains relatively constant. The change to the oxygen vacancy concentration of the $TiO_2$ region 306 due to application of voltage across the GCIB-treated resistance device is relatively large, thus the resistance R2 changes dramatically (e.g., from effectively non-conducting to conducting). Thus R1 is represented in FIG. 3B as a (substantially) fixed resistor, and R2 is represented by a variable resistor 302.

Figure 4A:
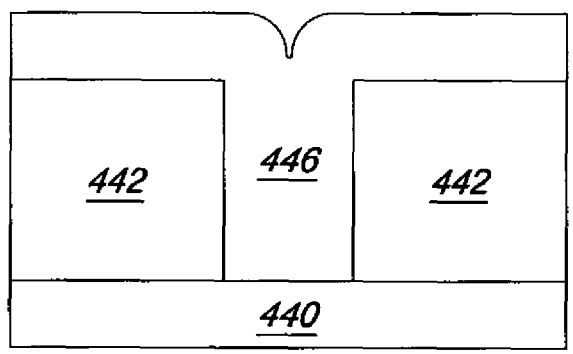
FIGS. 4A-4D are cross-sectional views illustrating a process for forming a GCIB-treated resistance device in accordance with one or more embodiments of the present disclosure.

FIGS. 4A-7E illustrate methods for forming a GCIB-treated resistance device according to one or more embodiments of the present disclosure. FIG. 4A is a cross-sectional view illustrating a process for forming a GCIB-treated resistance device after deposition of a conformal oxide film in accordance with one or more embodiments of the present disclosure. According to one or more embodiments of the present disclosure, a substrate 442 is formed upon a bottom (e.g., second) electrode 440.

The substrate 442 may be formed of silicon (Si), silicon dioxide ($SiO_2$), silicon carbide (SiC), or other dielectric material. The bottom electrode 440 may be formed of a metal or a metal oxide which forms a Schottky contact with an oxide. If the oxide film 446 is formed of an n-type oxide (e.g., $TiO_2$), then the bottom electrode 440 may be formed of a material having a relatively high work function, for example, platinum (Pt), ruthenium (Ru), iridium (Ir), iridium oxide ($IrO_X$), among others. If the oxide film 446 is formed of a p-type oxide (e.g., nitrogen oxide (NiO)), then the bottom electrode 440 may be formed of a material having a lower work function (e.g., titanium (Ti) or silver (Ag)), for example.

The substrate 442 may be formed to have a feature that will contain the active region of the GCIB-treated resistance device (e.g., opening, via) therein that is oriented approximately perpendicular to the bottom electrode 440 surface, or the feature may be formed in the substrate after the substrate is deposited, such as by masking and etching. The feature may, or may not, be of a high aspect ratio. According to one or more embodiments, the feature is fabricated to be 20 nm in depth, or less.

After formation of the feature, and according to one or more embodiments, a conformal oxide film 446 is formed within and over the feature and substrate 442. The oxide film may be formed of a material having a lower electron conductivity, a higher oxygen conductivity, and at least two resistance states. The oxide film may be a metal oxide film, such as a thin film of TiOx, NiOx, CuOx, AlOx, and/or a nitride material (e.g., metal nitrides such as aluminum nitride). For example, the oxide film may be a transition metal oxide, such as nickel oxide (NiO), cesium dioxide ($CsO_2$), a vanadium oxide ($VO_2$ or $V_2O_5$), niobium oxide ($Nb_2O_5$), a titanium oxide ($TiO_2$ or $Ti_2O_3$), tungsten oxide ($WO_3$), tantalum oxide ($Ta_2O_5$) or zirconium oxide ($ZrO_2$). However, embodiments of the present disclosure are not limited by the aforementioned oxides, and the active region may be formed of oxides, nitride, and combinations thereof, among others.

Figure 4B:
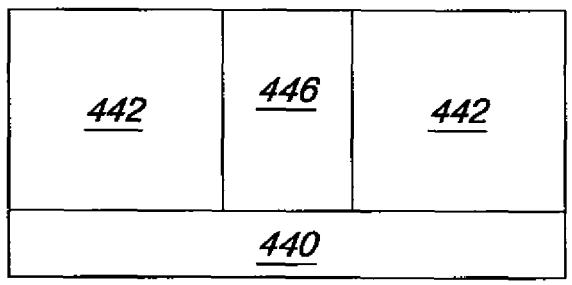

FIG. 4B is a cross-sectional view illustrating a process for forming a GCIB-treated resistance device after removal of a portion of the conformal oxide film in accordance with one or more embodiments of the present disclosure. FIG. 4B illustrates removal of the portion of the conformal oxide film 446 outside the feature, such as by chemical-mechanical planarization/polishing (CMP) or other etch back process.

Figure 4C:
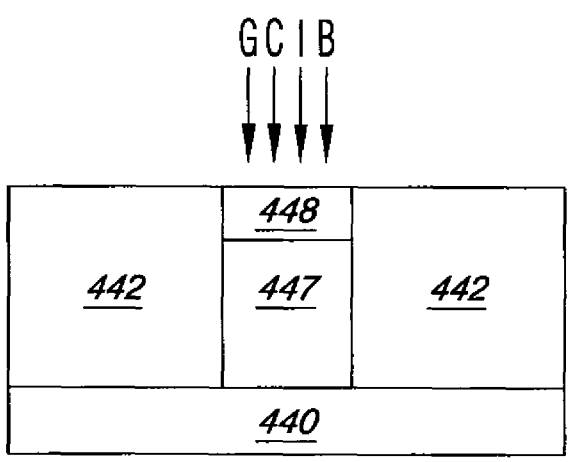

FIG. 4C is a cross-sectional view illustrating a process for forming a GCIB-treated resistance device after gas cluster ion beam (GCIB) infusion of the oxide film in accordance with one or more embodiments of the present disclosure. Following removal of the portion of the conformal oxide film 446 outside the feature, the remaining oxide film 446 (e.g., inside the feature in the substrate 442) is exposed to a GCIB to infuse a first (e.g., top) portion of the oxide film 446.

The fabrication methods of the present disclosure take advantage of certain characteristics of GCIB technology to create ionic gradients. GCIB treatment results in a uniform material with a known ionic (e.g., oxygen) profile, to a well-controlled depth. The GCIB treatment may be oxidizing, or reducing, depending on the starting metal oxide film 446. According to embodiments of the present disclosure, GCIB treatment is used to change the surface material to amorphous as part of the interaction during oxidation, deposition, or reduction. Thus, CCIB treatment can result in creation of a grain insensitive region since the GCIB process is self-limiting yielding a precisely-defined region (e.g., area within an active region).

Oxygen, nitrous, ammonia, hydrogen, deuterium, combinations thereof, or other appropriate gases can be used for the GCIB treatment. Combinations of gases can be selected to provide desired tuning of atomic ratios and vacancy concentrations. According to one or more embodiments of the present disclosure, GCIB treatment is used to create gradients in the metal to oxygen ratio (e.g., Ti to oxide ratio, Ni to oxide ratio) within a scale of 1 to 50 nm. According to some embodiments, GCIB treatment is used to create gradients in the metal to oxygen ratio within a range of from about 5 to about 20 nm.

According to other embodiments, GCIB treatment is used to create gradients in the metal to oxygen ratio within a range of from about 5 to about 15 nm.

Exposure to the GCIB results in the formation of a first region 448 (e.g., first portion of the active region) and a second region 447 (e.g., second portion of the active region), such as by causing oxygen vacancies to move from the first region 448 to the second region 447. For example, the homogeneous metal oxide film 446 can have an initial concentration of oxygen vacancies. GCIB exposure can result in causing a number of particular oxygen vacancies to move from their initial location in the molecular structure (e.g., lattice) of the metal oxide film 446, thereby forming two regions—a first region 448 having a resultant depleted oxygen vacancy concentration, and a second region 447 having a resultant enhanced oxygen vacancy concentration.

The wafer surface remains at room temperature during GCIB treatment, therefore the methods of fabrication presently disclosed are not limited to thermally stable pattern materials. For example, a photo resist could be used to maintain a self-aligned structure (e.g., application of a mask for formation of the feature within dielectric 442 within which the active region is formed, deposition of the oxide material only within the feature, GCIB treatment, followed by removal of the photo resist material).

Figure 4D:
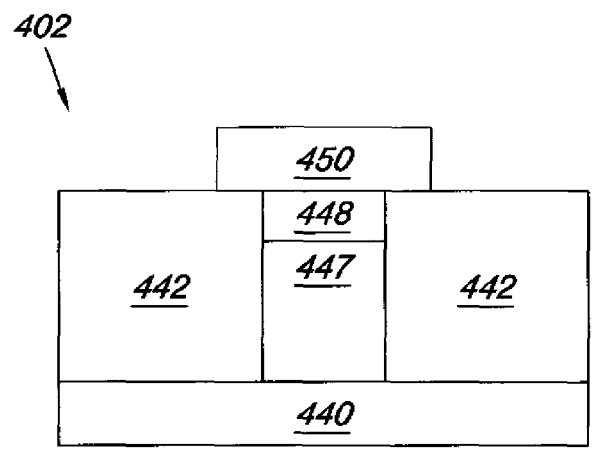

FIG. 4D is a cross-sectional view illustrating a process for forming a GCIB-treated resistance device 402 after top electrode formation in accordance with one or more embodiments of the present disclosure. After formation of the first region 448 and the second region 447, a top (e.g., first) electrode 450 can be formed adjacent the first region 448. The top electrode 450 may be formed of a metal or a metal oxide that forms an ohmic contact with an oxide. For example, the top electrode 450 may be formed of platinum (Pt), ruthenium (Ru), iridium (Ir), iridium oxide ($IrO_X$), among others.

According to one or more embodiments of the present disclosure, material used to form the active region of the GCIB-treated resistive device and the dopant species are chosen such that the drift of the ions (or vacancies) within the portions of the active region is possible but does not easily occur to ensure that the GCIB-treated resistive device will remain in whatever resistive state it is programmed for a period of time (e.g., many years at room temperature after the operating electric field has been removed). The metal oxide film can, for example, be formed by a physical vapor deposition (PVD) process (e.g., sputtering), an atomic material deposition (ALD) process, or a chemical vapor deposition (CVD) process, among other methods.

The ionic dopant species may be impurity atoms such as hydrogen or some other cation species, (e.g., alkali) or transition metals that act as an electron donor for the first portion of the active region. Alternatively, the dopant species may be anion vacancies, which are charged and therefore are also donors for a molecular lattice. It is also possible to drive anionic species between regions of the active region, one region becoming electron acceptors (e.g., hole donors).

The active region material may be a metal oxide film (less than about 50 nm thick), and is in many cases nanocrystalline, nanoporous or amorphous. The mobility of the dopant species in such nanostructured materials is much higher than in a bulk crystalline material, since diffusion can occur through grain boundaries, pores, or through local structural imperfections in an amorphous material. Also, because of the structure of the metal oxide film, the amount of time required to move enough dopant species into or out of a particular region of the metal oxide film to substantially change its conductivity can be rapid. For example, the time t required for a diffusive process can vary as the square of the distance covered. Therefore, the time to diffuse a distance of one nanometer is about one-millionth of the time to diffuse one micrometer.

The material of the active region may be (after fabrication is complete) contacted on either side by metal electrodes or wires. The contact of the metal to the material of the active region can deplete the semiconductor of free charge carriers, such that the material of particular portions of the active region can have a net charge that depends on the identity of the dopant species, which is positive in the case of donors and negative in the case of acceptors. The metal-semiconductor contact regions electrically resemble Schottky barriers. The traditional description of a metal-semiconductor Schottky barrier may be modified with respect to the GCIB-treated resistive device of the present disclosure by the fact that the materials are structured at the nanometer scale, and so the structural and electrical properties are not averaged over the large distances over which theory of semiconductor-metal contacts have been developed.

Conduction of electrons through the active region material is via quantum mechanical tunneling of the electrons. When a significant number of dopant species have been infused into the semiconducting material of one portion of the active region (e.g., by GCIB discussed below), the width and perhaps the height of the tunneling barrier are diminished by the potential of the charged species. This results in an increase of the conductivity through the active region (lower resistive state).

As noted above, the material of the active region (e.g., metal oxide) has certain properties that are useful in the practice of the present disclosure. One of these properties of the material is that it is a weak ionic conductor. The definition of a weak ionic conductor is based on the application for which a GCIB-treated resistive device is designed. The mobility and the diffusion constant for a species in a lattice are directly proportional to one another, via the "Einstein relation." Thus, if the mobility of ionized species in a lattice is very high, so is the diffusion constant. In general, it is desired for a switching device, such as a GCIB-treated resistance device, to stay in a particular state (e.g., resistive state) for an amount of time that may range from a fraction of a second to years, depending on the application.

Accordingly, a particular GCIB-treated resistance device can be fabricated to have an active region material with a diffusion constant low enough to ensure the desired level of stability, and to avoid inadvertently switching the device from one resistive state to another via ionized species diffusion, rather than by intentionally setting the state of the GCIB-treated resistance device with a applied voltage signal. Therefore, a "weak ionic conductor" is one in which the ion mobility, and thus the diffusion constant, is small enough to ensure the stability of the various resistance states of the GCIB-treated resistance device for as long as necessary under the conditions of intended use. "Strong ionic conductors" would have large ionized species mobilities and thus would not be stable against diffusion.

Figure 5A:
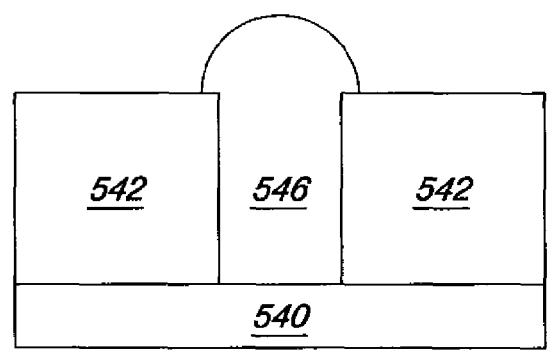
FIGS. 5A-5D are cross-sectional views illustrating a process for forming a GCIB-treated resistance device including growth of a metal oxide film in accordance with one or more embodiments of the present disclosure.

FIG. 5A is a cross-sectional view illustrating a process for forming a GCIB-treated resistance device after growth of a metal oxide film in accordance with one or more embodiments of the present disclosure. According to one or more embodiments of the present disclosure, a substrate 542 is formed upon a bottom (e.g., second) electrode 540. The substrate 542 may be formed to have a feature (e.g., opening, via) therein approximately perpendicular to the bottom electrode surface, or the feature may be formed in the substrate after the substrate is deposited, such as by masking and etching. The feature may, or may not, be of a high aspect ratio. According to one or more embodiments, the feature is fabricated to be about 20 nm in depth, or less.

After formation of the feature to contain the active region of the GCIB-treated resistance device, and according to one or more embodiments, an oxide film 346, such as a metal oxide film (e.g., TiOx, NiOx, CuOx) is formed within the feature, such as by being grown within the feature from the bottom up.

Figure 5B:
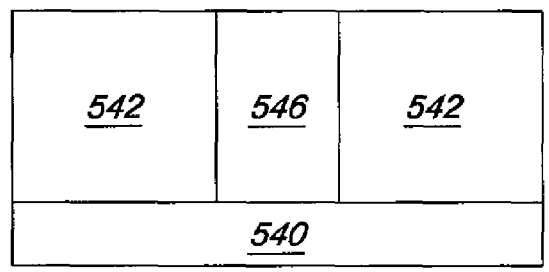

FIG. 5B is a cross-sectional view illustrating a process for forming a GCIB-treated resistance device after removal of a portion of the grown metal oxide film in accordance with one or more embodiments of the present disclosure. FIG. 5B illustrates removal of the portion of the grown metal oxide film 546 extending outside the feature, such as by CMP, or other etch back process, to arrive at an intermediate structure similar to that shown in FIG. 4B. The subsequent process, shown in FIGS. 5C and 5D, can be as described with respect to FIGS. 4C and 4D respectively.

Figure 5C:
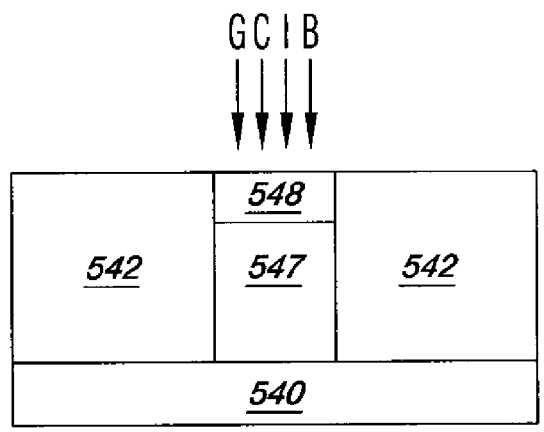

FIG. 5C is a cross-sectional view illustrating a process for forming a resistance device after GCIB treatment of the metal oxide film in accordance with one or more embodiments of the present disclosure. After removal of the portion of the grown metal oxide film 546 extending outside the feature, the remaining metal oxide film 546 (e.g., inside the feature in the substrate 542) is exposed to a GCIB to form a first (e.g., top) portion of the grown metal oxide film 546. The GCIB treatment may be oxidizing, or reducing, depending on the starting metal oxide film 546. Oxygen, nitrous, ammonia, hydrogen, deuterium, combinations thereof, or other appropriate gases can be used for the GCIB treatment. Combinations of the gases can be selected to provide desired tuning of atomic ratios and vacancy concentrations. Exposure to the GCIB results in the formation of a first region 548 and a second region 547, based on oxygen vacancy concentration, the first region 548 having an oxygen vacancy concentration depleted by the GCIB treatment, and the second region 547 having an oxygen vacancy concentration enhanced by the GCIB treatment.

Figure 5D:
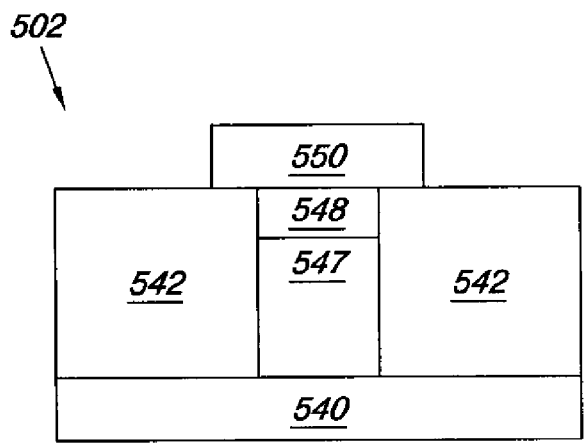

FIG. 5D is a cross-sectional view illustrating a process for forming a GCIB-treated resistance device 502 after top electrode definition in accordance with one or more embodiments of the present disclosure. After formation of the first region 548 and the second region 547, a top (e.g., first) electrode 550 is formed adjacent the first region 548.

Figure 6A:
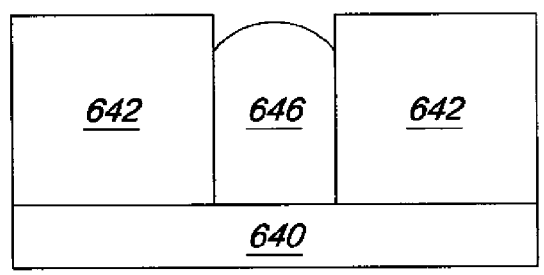
FIG. 6A-6C are cross-sectional views illustrating a process for forming a GCIB-treated resistance device including partial growth of a metal oxide film in accordance with one or more embodiments of the present disclosure.

FIG. 6A is a cross-sectional view illustrating a process for forming a GCIB-treated resistance device after partial growth of a metal oxide film in accordance with one or more embodiments of the present disclosure. FIG. 6A depicts a fabrication method similar to that shown in FIG. 5A, with the exception that the active region metal oxide material 646 is partially grown so that it does not extend outside the feature formed in substrate 642. That is, the active region metal oxide material 646 can be fully contained within the feature formed in substrate 642 and on electrode 640. As one having ordinary skill in the art will appreciate, partially growing the active region material with the feature eliminates the necessity for a removal process step, such as that illustrated between FIGS. 5A and 5B. Partial growth of the metal oxide material 646 within the feature of substrate 642 results in an active region somewhat recessed in the feature.

Figure 6B:
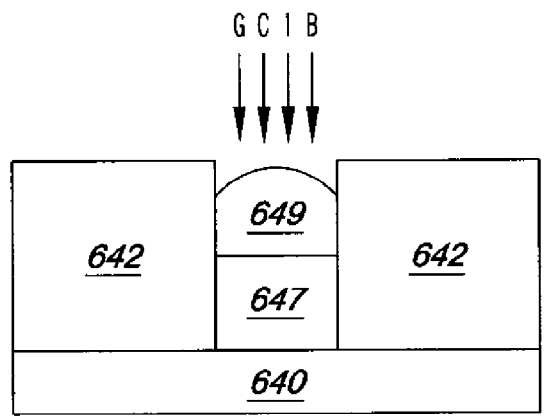

FIG. 6B is a cross-sectional view illustrating a process for forming a GCIB-treated resistance device after GCIB treatment of the partially grown metal oxide film in accordance with one or more embodiments of the present disclosure. Due to the anisotropic nature of the GCIB treatment, GCIB exposure can still be effective to form the initial active region material 646 to form a first region 649 and a second region 647, based for example on oxygen vacancy concentration, as has been previously described.

Figure 6C:
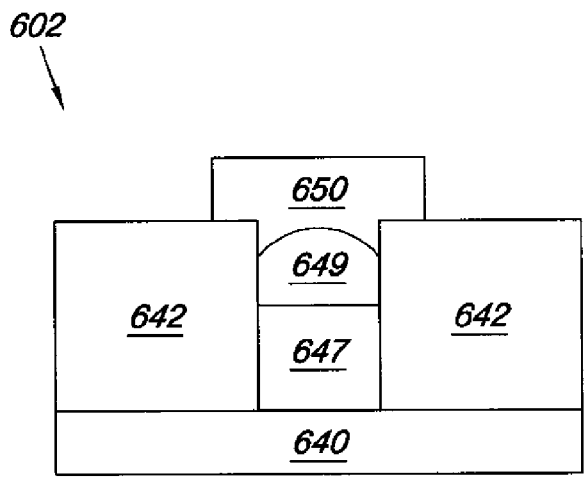

FIG. 6C is a cross-sectional view illustrating a process for forming a GCIB-treated resistance device 602 after top electrode definition in accordance with one or more embodiments of the present disclosure. After formation of the first region 649 and the second region 647, a top (e.g., first) electrode 650 is formed adjacent the first region 649 such that the electrode 650 extends into the feature as shown in FIG. 6C.

Figure 7A:
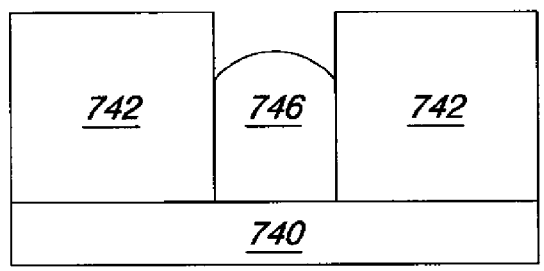
FIGS. 7A-7E are cross-sectional views illustrating a process for forming a GCIB-treated resistance memory including a recessed active region in accordance with one or more embodiments of the present disclosure.

FIG. 7A is a cross-sectional view illustrating a process for forming a GCIB-treated resistance memory including a recessed active region after partial growth of a metal oxide film in accordance with one or more embodiments of the present disclosure. GCIB is used to define one or more atomically-tuned zones (e.g., active regions with particular oxygen vacancy characteristics) recessed within the feature used to contain a GCIB-treated resistive device (e.g., in the middle of a GCIB-treated resistive device) by partially growing the active region material, treating by GCIB to form two regions therein, and then capping the active region with a deposited metal oxide. FIG. 7A is similar to FIG. 6A, showing partial growth of an active region metal oxide material 646 such that it does not extend outside the feature formed in substrate 742. That is, the active region metal oxide material 746 is fully contained within the feature formed in substrate 742 on electrode 740. According to one or more embodiments, the active region metal oxide material 746 may be recessed more, or less, than that of active region metal oxide material 646 shown in FIG. 6A.

As previously discussed with respect to FIG. 6A, one having ordinary skill in the art will appreciate that partially growing the active region metal oxide material 746 completely within the feature formed in substrate 742 and on electrode 740 eliminates the necessity for a removal process step, such as that illustrated between FIGS. 5A and 5B. Partial growth of the metal oxide material 746 within the feature of substrate 642 results in an active region recessed in the feature.

Figure 7B:
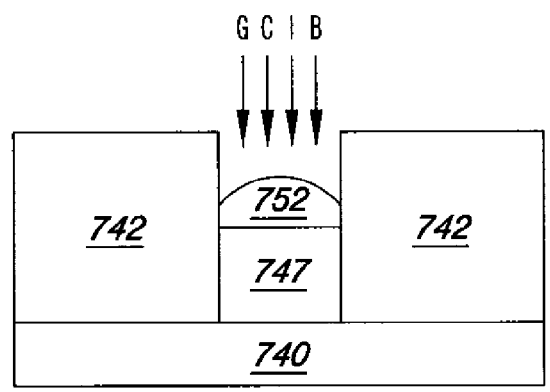

FIG. 7B is a cross-sectional view illustrating a process for forming a GCIB-treated resistance device after GOB treatment of the partially grown metal oxide film in accordance with one or more embodiments of the present disclosure. As discussed with respect to FIG. 6B, due to the anisotropic nature of the GCIB treatment, GCIB exposure is effective to form the initial active region material 746 so as to form a first region 752 and a second region 747, the regions being defined, for example, based on oxygen vacancy concentration.

Figure 7C:
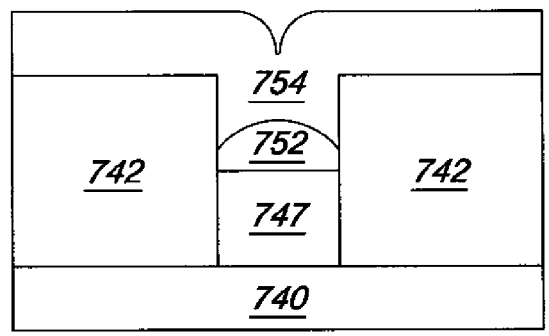

FIG. 7C is a cross-sectional view illustrating a process for forming a GCIB-treated resistance device after deposition of a conformal metal oxide film in accordance with one or more embodiments of the present disclosure. After partial growth of the active region metal oxide material 746, and GCIB exposure thereof to form a first 752 and second 747 region within the recessed active region, according to one or more embodiments, a conformal oxide film 754 is formed over the recessed active region atop the first region 752 and substrate 742. The conformal oxide film 754 may be formed of the same, or different, material as the active region material 746 initially grown within the feature. For example, the conformal oxide film may be a metal oxide film, such as TiOx, NiOx, CuOx. The thin metal oxide film can, for example, be formed by atomic material deposition (ALD), or chemical vapor deposition (CVD), among other methods.

Figure 7D:
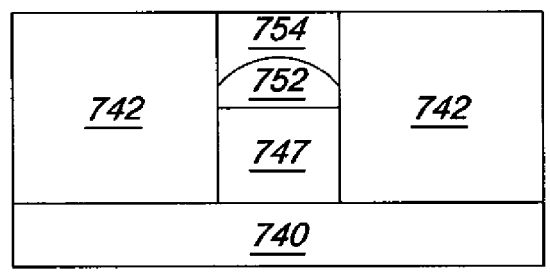

FIG. 7D is a cross-sectional view illustrating a process for forming a GCIB-treated resistance device after removal of a portion of the conformal metal oxide film 754 in accordance with one or more embodiments of the present disclosure. FIG. 7D illustrates removal of the portion of the conformal metal oxide film 754 outside the feature, such as by chemical-mechanical planarization/polishing (CMP) or other etch back process. According to one or more embodiments, and unlike that which was shown and described with respect to FIG. 2C, the conformal metal oxide film 754 is not further subjected to a GCIB treatment. One having ordinary skill in the art will appreciate that formation of the conformal metal oxide film 754 over the first region 752 results in a GCIB-treated resistive device having a fully recessed active region within the feature. The feature is nominally configured to have a dimension perpendicular to the region boundaries in the range of 20 nm or less.

Figure 7E:
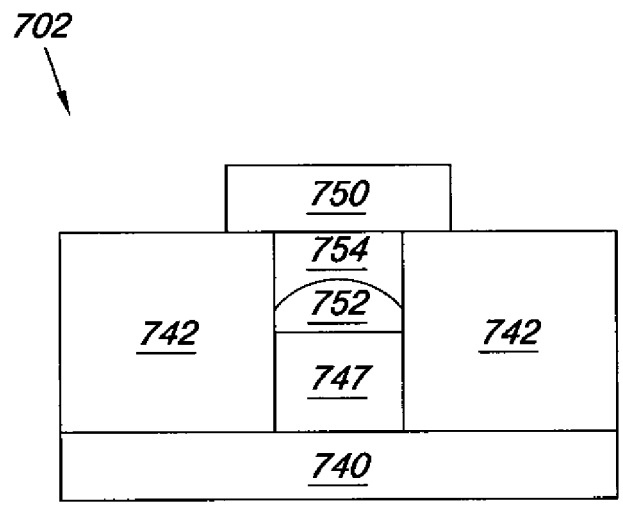

FIG. 7E is a cross-sectional view illustrating a process for forming a GCIB-treated resistance device 702 after top electrode definition in accordance with one or more embodiments of the present disclosure. After removal of a portion of the conformal metal oxide film 754, a top (e.g., first) electrode 750 is formed adjacent the conformal metal oxide film 754.

Burying the active region (e.g., first 747 and second 752 regions) of the GCIB-treated resistive device can have the advantages of maintaining stable oxygen concentrations in the active region. In addition, certain thermal considerations associated with joule heating of the active region benefit from burying the active region, since such a configuration isolates the active region within the dielectric substrate 742.

Because of the cyclic capability of GCIB, the disclosed fabrication methods may also be used to make laminates of differential atomic ratios to optimize certain characteristics of the GCIB-treated resistive device. For example, a laminate may be formed by repetitive deposition/growth of an oxide material followed by GCIB.

The disclosed methods can also be applied to electrolyte cell memory fabrication, where a thin oxide is used to act as a regulating barrier for ion and electron movement during cycling of the memory cell. For example, a Ge-based electrolyte memory cell may be fabricated by formation of a GeOx material (treated by GCIB) with a Ge material formed atop the GeOx material.

Figure 8:
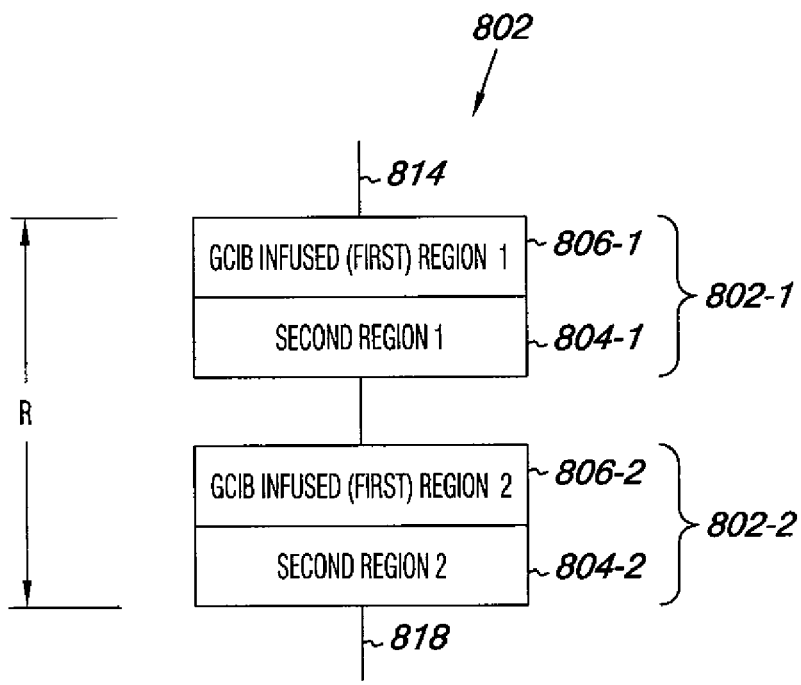
FIG. 8 illustrates an example stacked RRAM structure having multiple resistance states that can be implemented as the memory element in FIG. 1 according to one or more embodiments of the present disclosure.

FIG. 8 illustrates an example stacked RRAM structure having multiple resistance states that can be implemented as the GCIB-treated resistance device in FIG. 1 according to one or more embodiments of the present disclosure. One having ordinary skill in the art will appreciate that multiple resistance states may be achieved by coupling multiple GCIB-treated resistance devices in series and/or parallel combinations. FIG. 8 shows a first GCIB-treated resistance device 802-1 and a second GCIB-treated resistance device 802-2 connected in series. First GCIB-treated resistance device 802-1 may be fabricated to have first resistance characteristics, and second GCIB-treated resistance device 802-2 may be fabricated to have second resistance characteristics.

The overall resistance, R, of the series connected GCIB-treated resistance device is the sum of the resistances of the GCIB-treated resistance device. One skilled in the art can extrapolate the method by which an active region may be buried within a feature as shown with respect to FIGS. 7A-E, to form GCIB-treated resistive devices having multiple active regions. With appropriate control logic, it is therefore possible to achieve four discrete values of total resistance, R, thereby enabling fabrication of a multilevel memory cell. Embodiments of the present disclosure are not limited to four resistance states as shown and described with respect to FIG. 8. One having ordinary skill in the art will appreciate that more or fewer states may be obtained by various combinations of GCIB-treated resistance device, having various low and high resistance states.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming a GCIB-treated resistive device, comprising:
   forming a lower electrode;
   forming an oxide material over the lower electrode;
   exposing the oxide material to a gas cluster ion beam (GCIB) until a change occurs in resistance of a first portion of the oxide material relative to the resistance of a second portion of the oxide material; and
   forming an upper electrode on the first portion.

2. The method of claim 1, wherein the GCIB is configured to change the concentration of an ionic species in the molecular structure of the first portion of the oxide material relative to the concentration of ionic species in the molecular structure of the second portion of the oxide material.

3. The method of claim 1, wherein the GCIB is configured to change a concentration of oxygen vacancies in a molecular structure of the first portion of the oxide material relative to the concentration of oxygen vacancies in the molecular structure of the second portion.

4. The method of claim 3, wherein the oxide material has a molecular structure with an initial homogeneous concentration of oxygen vacancies.

5. The method of claim 3, wherein exposing the oxide material to the GCIB drives some of the oxygen vacancies in the molecular structure of the oxide material from the first portion to the second portion.

6. The method of claim 3, wherein exposing the oxide material to the GCIB drives some of the oxygen vacancies in the molecular structure of the oxide material from the second portion to the first portion.

7. The method of claim 1, including maintaining a surface of the oxide material at room temperature during the exposure of the oxide material to the GCIB.

8. The method of claim 1, wherein exposing the oxide material to the GCIB changes the molecular structure of the first portion to amorphous during oxidation.

9. The method of claim 1, exposing the oxide material to the GCIB changes the molecular structure of the first portion to amorphous during reduction.

10. The method of claim 1, wherein forming the oxide material includes forming a metal oxide material.

11. The method of claim 10, wherein exposing the oxide material to the GCIB creates a gradient in a metal to oxide ratio.

12. The method of claim 11, including creating the gradient in the metal to oxide ratio within a range of 1 to 50 nm.

13. The method of claim 10, wherein forming the metal oxide material includes forming a $TiO_X$ material.

14. The method of claim 10, wherein forming the metal oxide material includes forming a $NiO_X$ material.

15. The method of claim 10, wherein forming the metal oxide material includes forming a $CuO_X$ material.

16. The method of claim 10, including exposing the oxide material to the GCIB having at least one gas selected from a group that includes: oxygen, nitrous, ammonia and deuterium.

17. The method of claim 10, wherein forming the metal oxide material includes forming a transition metal oxide material.

18. The method of claim 10, including forming a feature in the metal oxide material having a depth of 20 nm or less.

19. The method of claim 10, wherein the first portion of the metal oxide material is a grain insensitive material.

20. A memory cell, comprising:
a GCIB-treated resistive device formed by the method of claim 1 and coupled to a bit line; and
an access transistor coupled to the GCIB-treated resistive device, and having a gate coupled to a word line.

21. A method of operating a GCIB-treated resistive device formed by the method of claim 1, comprising:
applying a first voltage signal of a first polarity, magnitude, and duration sufficient to cause the GCIB-treated resistive device to adopt a first resistance state; and
applying a second voltage signal of a second polarity, magnitude, and duration sufficient to cause the GCIB-treated resistive device to adopt a second resistance state,
wherein application of the first and second voltage signals causes oxygen vacancies to move between a first region and a second region established in the GCIB-treated resistive device by gas cluster ion beam exposure.

22. A GCIB-treated resistive device produced according to the process of claim 1.

23. A GCIB-treated resistive device, comprising:
a lower electrode;
an oxide material formed over the lower electrode, the oxide material including a first portion and a second portion each having an initial concentration of oxygen vacancies, the oxide material being exposed to a gas cluster ion beam (GCIB) to change the concentration of oxygen vacancies in the first portion of the oxide material relative to the concentration of oxygen vacancies in the second portion of the oxide material; and
an upper electrode formed on the first portion,
wherein resistance of the oxide material portions vary corresponding to the concentration of oxygen vacancies in the molecular structure of the first portion of the oxide material relative to the concentration of oxygen vacancies in the molecular structure of the second portion.

24. The GCIB-treated resistive device of claim 23, wherein the GCIB-treated resistive device is configured to be a memory element.

25. The GCIB-treated resistive device of claim 23, wherein the GCIB-treated resistive device is configured to be a switch.

26. The GCIB-treated resistive device of claim 23, wherein the GCIB-treated resistive device is configured to be a variable resistor.

27. A method for forming a GCIB-treated resistive device, comprising:
forming a lower electrode;
forming a semiconductor material on the lower electrode, the semiconductor being formed of a material including an initial concentration of an ionic species in a molecular structure of the semiconductor;
exposing the semiconductor material to a gas cluster ion beam (GCIB) until a change occurs in resistance of a first portion of the semiconductor material relative to the resistance of a second portion of the semiconductor material; and
forming an upper electrode on the first portion.

28. The method of claim 27, wherein the GCIB is configured to change the concentration of an ionic species in the molecular structure of the first portion of the semiconductor material relative to the concentration of ionic species in the molecular structure of the second portion of the semiconductor material.

29. The method of claim 28, wherein the semiconductor material has a molecular structure with an initial homogeneous concentration of ionic species that can be modified by GCIB exposure.

30. The method of claim 28, wherein ionic species includes nitrogen ions.

31. The method of claim 27, wherein forming a semiconductor material includes forming an aluminum nitride material.

32. The method of claim 31, wherein exposing the semiconductor material to the GCIB drives some of the nitrogen ions in the molecular structure of the semiconductor material from the first portion to the second portion.

33. The method of claim 31, wherein exposing the semiconductor material to the GCIB drives some of the nitrogen ions in the molecular structure of the semiconductor material from the second portion to the first portion.

34. A method for forming a GCIB-treated resistive device, comprising:
forming a lower electrode;
forming a dielectric material on the lower electrode;
forming a feature in the dielectric material having a dimension measured from the lower electrode of 20 nm or less;
growing an oxide material in the feature;
exposing the oxide material to a gas cluster ion beam (GCIB) until a change occurs in concentration of oxygen vacancies in the molecular structure of a first portion of the oxide material relative to a second portion of the oxide material; and
forming an upper electrode on the first portion,
wherein resistance of the oxide material portions vary corresponding to the concentration of oxygen vacancies in the molecular structure of the first portion of the oxide material relative to the concentration of oxygen vacancies in the molecular structure of the second portion.

35. The method of claim 34, including removing a portion of the oxide material extending outside the feature prior to exposing the oxide material to the GCIB.

36. A GCIB-treated resistive device produced according to the process of claim 34.

37. A method for forming a GCIB-treated resistive device, comprising:
- forming a lower electrode;
- forming a dielectric material on the lower electrode;
- forming a feature in the dielectric material having a dimension measured from the lower electrode of 20 nm or less;
- growing a first oxide material in the feature;
- exposing the first oxide material to a gas cluster ion beam (GCIB) until a change occurs in concentration of oxygen vacancies in the molecular structure of a first portion of the first oxide material relative to a second portion of the first oxide material; and
- forming a second oxide material on the first portion; and
- forming an upper electrode on the second oxide material,
- wherein resistance of the first oxide material portions vary corresponding to the concentration of oxygen vacancies in the molecular structure of the first portion of the first oxide material relative to the concentration of oxygen vacancies in the molecular structure of the second portion.

38. A GCIB-treated resistive device produced according to the process of claim 37.

* * * * *